(12) United States Patent
Miyazaki

(10) Patent No.: US 6,444,047 B1
(45) Date of Patent: Sep. 3, 2002

(54) METHOD OF CLEANING A SEMICONDUCTOR SUBSTRATE

(75) Inventor: Kunihiro Miyazaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/477,017

(22) Filed: Jan. 3, 2000

(30) Foreign Application Priority Data

Jan. 4, 1999 (JP) .......................................... 11-000140

(51) Int. Cl.⁷ .............................. B08B 3/00; B08B 3/04; B08B 3/08
(52) U.S. Cl. ............................. 134/36; 134/2; 134/21; 134/26; 134/30; 134/153; 134/154
(58) Field of Search ................................ 134/2, 21, 26, 134/36, 30, 153, 154, 157

(56) References Cited

U.S. PATENT DOCUMENTS

| | | | |
|---|---|---|---|
| 5,806,126 A | * | 9/1998 | de Larios et al. ................. 13/7 |
| 5,887,605 A | | 3/1999 | Lee et al. ................. 134/102.2 |
| 6,248,179 B1 | * | 6/2001 | Severac et al. ................. 132/3 |
| 6,273,104 B1 | * | 8/2001 | Shinbara et al. ........... 134/25.4 |

FOREIGN PATENT DOCUMENTS

| | | |
|---|---|---|
| JP | 6-320099 | 11/1994 |
| JP | 10-4075 | 1/1998 |
| JP | 11-97402 | 4/1999 |
| JP | 11-102882 | 4/1999 |

\* cited by examiner

*Primary Examiner*—Zeinab El-Arini
(74) *Attorney, Agent, or Firm*—Finnegan, Henderson, Farabow, Garrett & Dunner, L.L.P.

(57) ABSTRACT

A method of cleaning a semiconductor substrate is disclosed. The method comprises setting a substrate to-be-treated substantially in parallel to ends of multi-nozzles including an inner tube nozzle and an outer tube nozzle to oppose each other, cleaning the substrate by discharging, to the substrate, a chemical fluid, a combination of chemical fluid and a gas, pure water, or a combination of pure water and a gas through the outer tube nozzle and simultaneously discharging a chemical fluid, a combination of a chemical fluid and a gas, pure water, or a combination of pure water and a gas through the inner tube nozzle, and washing the substrate by discharging pure water to the substrate through at least one of the inner tube nozzle and the outer tube nozzle.

6 Claims, 3 Drawing Sheets

METHOD OF CLEANING A SEMICONDUCTOR SUBSTRATE

BACKGROUND OF THE INVENTION

The present invention relates to a substrate treating apparatus for treating semiconductor wafers and the like and a substrate treating method using the treating apparatus.

A semiconductor device, such as an IC or LSI, is manufactured in processes including a designing process for designing an integrated circuit to be formed on a semiconductor substrate, a mask forming process for delineating electron beams and the like that are used to form the integrated circuit, and a wafer manufacturing process for forming a semiconductor wafer of a given thickness from a single-crystal ingot. The manufacturing processes further include wafer treating processes for forming the integrated circuit or semiconductor device on the semiconductor wafer, an assembly process for dividing the semiconductor wafer into semiconductor substrates and packaging each substrate to form a semiconductor device, an inspection process. The wafer treating processes include a thin film forming process, oxidation process, doping process, resist treatment process, exposure process, etching process, cleaning process, etc. A dedicated manufacturing device is provided for each wafer treating process. The semiconductor manufacturing devices further include an exhaust gas processing device, which is an essential device for environmental health.

A plurality of chemical fluids may be mixed as they are used in some conventional substrate cleaning devices. As shown in FIG. 5, chemical fluids 1 and 2 are introduced into a mixing tank 10 through nozzles, individually, and mixed into a fluid mixture 3 in the tank. The fluid mixture 3 in the tank 10 is guided onto a to-be-treated substrate (semiconductor wafer) 5 through a pipe. The mixture 3 is discharged through a nozzle 6, which is connected to the pipe, to clean the surface of the semiconductor wafer 5. After the wafer surface is thus cleaned with the chemical fluids, it is washed by pure water 4 discharged from a nozzle 7. Thereafter, the semiconductor wafer is dried. As shown in FIG. 6, two or more nozzles may be located close to the semiconductor wafer 5 so that chemical fluids 1 and 2 can be discharged through their corresponding nozzles to be mixed on the semiconductor wafer 5. In either of the systems shown in FIGS. 5 and 6, the chemical fluid treatment and water washing operation are carried out in an open-to-atmosphere system or in a chamber that is large enough to hold the semiconductor wafer, nozzles, etc. therein.

According to the conventional system shown in FIG. 5, the fluid mixture is prepared in advance, so that chemical fluids that can be decomposed by mixing, such as a fluid mixture of HCl and $H_2O_2$, mixture of $NH_4OH$ and $H_2O_2$, etc., may change their compositions with time as their active $H_2O_2$ is decomposed by reaction even while the semiconductor wafer is not being treated. According to the conventional system shown in FIG. 6, on the other hand, the chemical fluids decompose and change less with time. If the two or more nozzles discharge the chemical fluids in different positions, however, the fluids cannot be mixed uniformly enough over the semiconductor substrate.

According to either of the techniques shown in FIGS. 5 and 6, the chemical fluids produce mists in the fluid treatment in the open-to-atmosphere system or in the chamber that is large enough to hold the wafer, nozzles, etc. therein. In the case of the fluid mixture of $NH_4OH$ and $H_2O_2$ or HCl and $H_2O_2$, ammonia, hydrochloric acid, or other highly volatile components may volatilize during the wafer treatment, so that the chemical fluid composition in the discharge region is different from that in the outer peripheral portion of the semiconductor wafer that is distant from the discharge region. Further, $NH_3$ or HCl gas may be discharged into the environment, thereby arousing a problem of environmental pollution. In another case, $O_2$, $CO_2$, and other impurities in the atmosphere may penetrate into the pure water during the water washing operation, thus exerting a bad influence on the semiconductor wafer.

BRIEF SUMMARY OF THE INVENTION

The present invention has been contrived in consideration of these circumstances, and its object is to provide a semiconductor manufacturing apparatus for treating a semiconductor wafer in sheet form, in which chemical fluids can spread uniformly over the semiconductor wafer without substantially decomposing and changing their compositions, so that production of mists or volatilization of the chemical fluids over the surface of the semiconductor wafer can be restrained, and a substrate treating method using the manufacturing apparatus.

According to the present invention, there is provided a substrate treating apparatus that is used in an etching process, cleaning process, etc. for wafer treatment, out of manufacturing processes a semiconductor device. This treating apparatus has a multi-nozzle structure, such as a double-nozzle structure, including an outer tube nozzle, through which at least a chemical fluid or a combination of a chemical fluid and a gas is discharged onto a semiconductor wafer, and an inner tube nozzle, through which at least a chemical fluid or a combination of a chemical fluid and a gas can be discharged into the outer tube nozzle. The wafer top of the outer tube has a structure that extends parallel to the semiconductor wafer, and is adapted to be not contact with the semiconductor wafer as the chemical fluid or gas is discharged from a region near a discharge port during treatment.

The chemical fluids are discharged simultaneously through the multi-nozzle so that they can be efficiently mixed near the semiconductor wafer, and the outer tube nozzle is provided with a cover plate (hereinafter referred to as a wafer top) that serves as a top plate for the semiconductor wafer. Thus, the chemical fluids can be restrained from producing mists or volatilizing. Moreover, since the outer tube nozzle has the wafer top, the area of contact between pure water and the atmosphere is. so small that impurities in the atmosphere can be restrained from penetrating into the pure water during water washing operation. If $N_2$ is discharged from the outer tube nozzle or the inner tube nozzle therein in a drying process, furthermore, introduction of the atmosphere is limited, so that production of watermarks, which requires oxygen, can be also restrained.

A substrate treating apparatus according to a first aspect of the present invention comprises an outer tube nozzle through which a chemical fluid, a combination of a chemical fluid and a gas, pure water, or a combination of pure water and a gas is discharged onto a substrate to be treated; and an inner tube nozzle through which a chemical fluid, a combination of a chemical fluid and a gas, pure water, or a combination of pure water and a gas is discharged onto the to-be-treated substrate, the inner tube nozzle being provided in the outer tube nozzle in such a manner that the inner tube nozzle and the outer tube nozzle constitute a multi-nozzle structure, wherein the outer tube nozzle has at a distal end thereof a wafer top for the to-be-treated substrate, the wafer top extending parallel to the to-be-treated substrate from the distal end and being adapted to be not in contact with the to-be-treated substrate during treatment.

In the substrate treating apparatus according to the first aspect of the present invention, the inner tube nozzle may be located so that it is coaxial with the outer tube nozzle.

In the substrate treating apparatus according to the first aspect of the present invention, the to-be-treated substrate supporting stage may be located under the multi-nozzle so as to face the same and be rotatable in a manner such that its center of rotation is coincident with the center of the multi-nozzle. A moving up/down apparatus for moving up/down the supporting stage may be provided so to adjust a distance between the to-be-treated substrate and the wafer top of the outer tube nozzle during treatment.

In the substrate treating apparatus according to the first aspect of the present invention, a space defined between the to-be-treated substrate and the wafer top of the outer tube nozzle may be filled up with the chemical fluid while the chemical fluid is being discharged.

In the substrate treating apparatus according to the first aspect of the present invention, a diameter of the wafer top of the outer tube nozzle may be twice as large as an outside diameter of the outer tube nozzle or larger and is 20% or more of a diameter of the-to-be-treated substrate. Since the effect of the wafer treatment varies depending on the capacity of a treatment chamber, the diameter of the wafer top of the outer tube nozzle should preferably be twice as large as an outside diameter of the outer tube nozzle or larger and be 20% or more of a diameter of the to-be-treated substrate. Since the function and effect of the present invention are remarkable if the top structure is sized in this manner, the area of the to-be-treated substrate should be set correspondingly.

A substrate treating method according to a second aspect of the present invention comprises a process for opposing an outer tube nozzle through which a chemical fluid, a combination of a chemical fluid and a gas, pure water, or a combination of pure water and a gas is discharged and an inner tube nozzle provided in the outer tube nozzle through which inner tube nozzle a chemical fluid, a combination of a chemical fluid and a gas, pure water, or a combination of pure water and a gas is discharged, to a substrate to be treated, the inner tube nozzle and the outer tube nozzle constituting a substrate treating apparatus with a multi-nozzle structure, a process for discharging the chemical fluid or the combination of the chemical fluid and the gas through the nozzles to clean the to-be-treated substrate with the resulting mixture; and a process for washing the to-be-treated substrate cleaned with the resulting fluids, by pure water discharged through at least one of the inner tube nozzle and the outer tube nozzle.

In the substrate treating method according to the second aspect of the present invention, the method may further comprises a process for drying the to-be-treated substrate washed by pure water. The gas may be discharged through at least one of the inner tube nozzle and the outer tube nozzle during the drying process lest the atmosphere be able to be introduced into the gap between the to-be-treated substrate and the substrate treating apparatus.

In the substrate treating method according to the second aspect of the present invention, the gas may be discharged through at least one of the inner tube nozzle and the outer tube nozzle during the drying process is nitrogen.

In the substrate treating method according to the second aspect of the present invention, the substrate treating apparatus may be set in a treatment chamber having a nitrogen atmosphere therein.

If $N_2$ is discharged through the outer tube nozzle during the drying process, the atmosphere cannot penetrate through the gap between the semiconductor wafer and the wafer top, so that an $N_2$ atmosphere can be formed over the wafer surface. Thus, production of watermarks that is attributable to the presence of oxygen in the atmosphere can be restrained.

In the case where the semiconductor wafer is rotated by means of a rotating chuck as the fluid mixture is discharged through the coaxial multi-nozzle, the chemical fluids can be spread more uniformly over the semiconductor wafer if the respective discharge centers of the outer and inner tube nozzles are on the center of rotation of the semiconductor substrate. The optimum value of the distance between the wafer top and the semiconductor wafer changes depending on the delivery of the chemical fluids or pure water and the delivery of $N_2$. By freely adjusting this distance, therefore, production of mists or volatilization of the fluids can be restrained most effectively. During the water washing operation, moreover, the pure water is never touched by the atmosphere, so that impurities in the atmosphere can be fully prevented from penetrating into the pure water.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

Figure 1:
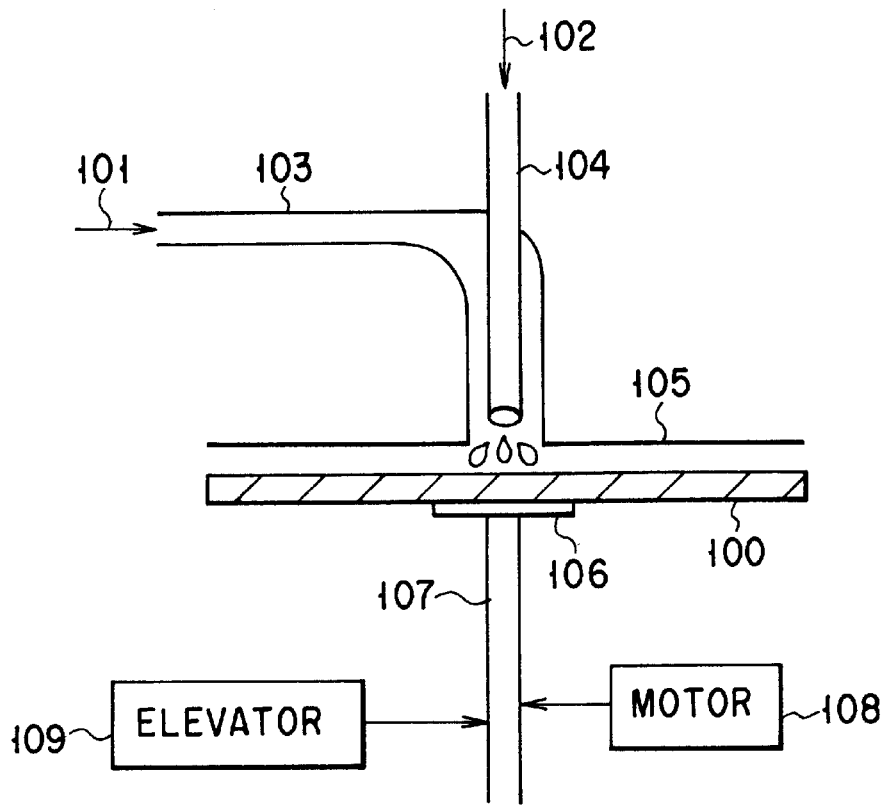
FIG. 1 is a sectional view of a substrate treating apparatus according to a first embodiment of the present invention.
Figures 2A, 2B:
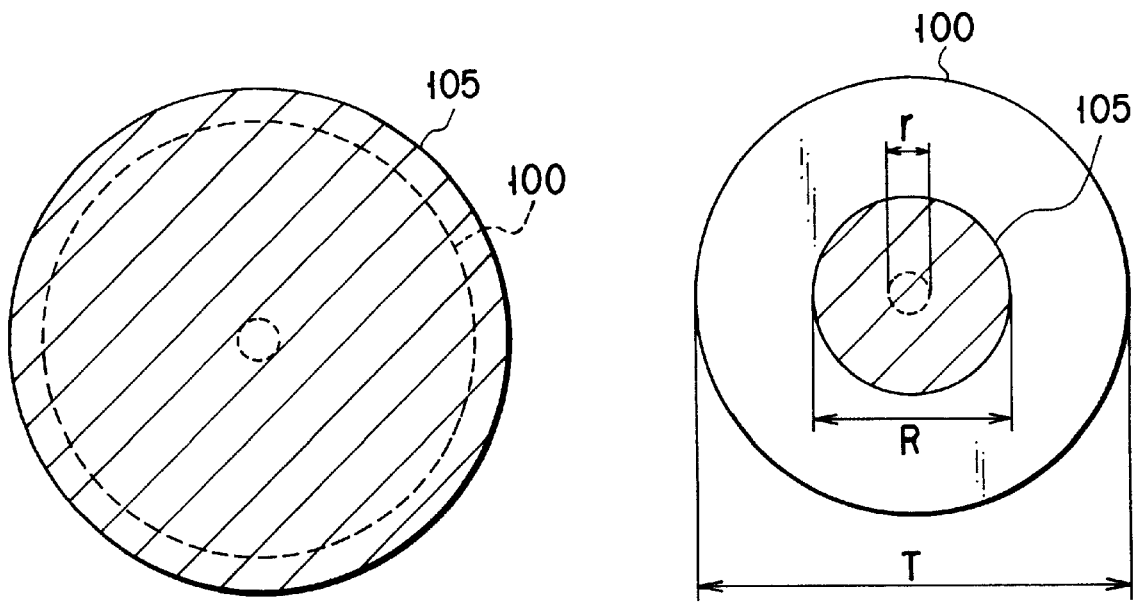
FIG. 2A is a plan view showing a semiconductor wafer and a wafer top according to the present invention.
FIG. 2B is a plan view showing a semiconductor wafer and a wafer top in an another Example of the first embodiment of the present invention.

A first embodiment of the invention will first be described with reference to FIGS. 1, 2A and 2B. FIG. 1 is a sectional view of a substrate treating apparatus, and FIG. 2A is a plan view showing a wafer top and a semiconductor wafer in the substrate treating apparatus shown in FIGS. 1 and 2B is a plan view showing a wafer top and a semiconductor wafer in an another example.

The treating apparatus may be located in an adjustable-atmosphere chamber to carry out a treating operation. Alternatively, the treating apparatus may be located in an open-to-atmosphere system to carry out a treating operation. This embodiment show a case where the device is located in an open-to-atmosphere system.

The substrate treating apparatus is provided with a stage 106 that supports a semiconductor wafer 100 as a substrate to be treated. The stage 106 is fitted with a rotating chuck 107. The rotating chuck 107 is rotated by a motor 108, whereby the stage 106 can be rotated with the semiconductor wafer 100 thereon. The semiconductor wafer 100 is supported on the stage 106 so as to face a multi-nozzle. The multi-nozzle is composed of an outer tube nozzle 103, which is connected to a supply pipe, and an inner tube nozzle 104 coaxially located in the outer tube nozzle 103. Although only one inner tube nozzle is used in this embodiment, two or more inner tube nozzles may be coaxially arranged so that more chemical fluids can be mixed.

A wafer top 105 is mounted on the distal end portion of the outer tube nozzle 103 that faces the semiconductor wafer 100. It extends parallel to the semiconductor wafer 100. The wafer top 105 is attached on the distal end portion of the outer tube nozzle 103, and thus there is no space formed therebetween. In this embodiment described above, it is preferable that the wafer top attached to the outer tube nozzle has an area equal to or greater than the wafer area, as shown in FIG. 2A, since the treating apparatus is located in an open-to-atmosphere.

Chemical fluids, pure water, inert gas, etc. are supplied through supply pipes to the outer and inner tube nozzles 103 and 104, and discharged from the outer and inner tube nozzles 103 and 104. When the chemical fluids are simultaneously discharged, they are mixed in the vicinity of the discharge ports of the nozzles 103 and 104, that is, near the semiconductor wafer 100, and the resulting fluid mixture is supplied onto the surface of the semiconductor wafer 100 to clean the wafer surface.

After the semiconductor wafer 100 is mounted on the stage 106, the rotating chuck 107 is rotated by the motor 108 to turn the semiconductor wafer 100. As the semiconductor wafer 100 is rotated, the fluid mixture is discharged from the multi-nozzles onto the semiconductor wafer. It is preferable that the respective discharge centers of the outer and inner tube nozzles 103 and 104 are on the center of the semiconductor wafer 100. In such a case, chemical fluids 101 and 102 that are discharged through the nozzles 103 and 104 spread uniformly over the semiconductor wafer 100. Thus, the mixture of the chemical fluids 101 and 102 is not subject to unevenness.

Since the rotating chuck 107 can be moved up and down by an elevator 109, the distance between the wafer top 105 and the semiconductor wafer 100 can be adjusted freely. This distance can be adjusted when the chemical fluids or pure water is discharged so that a space between the semiconductor wafer 100 and the wafer top 105 is filled up with the chemical fluid mixture or pure water to prevent the atmosphere from penetrating through the gap between the semiconductor wafer and the wafer top.

In the case where a cleaning process, among other wafer treating processes, is carried out by using the substrate treating apparatus according to this embodiment, the semiconductor wafer 100 is cleaned with the chemical fluids and then with pure water, and thereafter, subjected to a drying process. In this drying process, an $N_2$ atmosphere can be maintained between the wafer top 105 and the semiconductor wafer 100 by discharging nitrogen ($N_2$) gas from the outer and inner tube nozzles 103 and 104.

The apparatus according to this embodiment is provided with the wafer rotating mechanism. According to the present invention, however, the wafer rotating mechanism need not be used unless wafer drying is required.

According to the embodiment described above, the wafer top that is attached to the outer tube nozzle has an area equal to or greater than the wafer area, as shown in FIG. 2A. However, the wafer top according to the invention is not limited to this size. If this embodiment is carried out with use of the open-to-atmosphere system, the outside air has a great influence, so that the wafer top should preferably be equal to or greater than the semiconductor wafer in size. This does not apply, however, to the case where the substrate treating apparatus is stored in a treatment chamber. Since the effect of the wafer treatment varies depending on the capacity of the treatment chamber, the diameter (R) of the wafer top should preferably be twice as large as the outside diameter (r) of the outer tube nozzle or larger, as shown in FIG. 2B. Since the function and effect of the present invention are remarkable if the wafer top diameter is 20% or more of the wafer diameter (T), the area of the wafer top should be set correspondingly. FIG. 2A is a plan view of the semiconductor wafer and wafer top of the substrate treating apparatus shown in FIG. 1, and FIG. 2B is a plan view of a semiconductor wafer and wafer top in another example.

In the case where the wafer surface is not fully covered by the wafer top, the outer tube nozzle having the wafer top structure and the inner tube nozzle may be designed so that they can be scanned together in a direction parallel to the wafer surface or any other direction. Thus, the multi-nozzle can be moved freely over the semiconductor wafer.

According to this embodiment, as described above, pure water or different chemical fluids are simultaneously discharged from the multi-nozzle, and the fluids are mixed immediately before the discharge in the vicinity of the semiconductor wafer. Unlike the prior art case where a fluid mixture is prepared in advance, therefore, there is no possibility of the chemical fluids, such as hydrogen peroxide, decomposing and changing their compositions. In contrast with the prior art case where a plurality of nozzles are arranged directly in front of a semiconductor wafer so that there are different discharge positions, the chemical fluids that are discharged individually from the outer and inner tube nozzles spread uniformly over the semiconductor wafer, so that the mixture of the fluids is less liable to unevenness. Since the semiconductor wafer top is mounted on the distal end portion of the discharge port side of the outer tube nozzle and thus no open-air-space exists therebetween, the chemical fluids over the wafer surface can be restrained from producing mists or volatilizing, and the area of contact between the atmosphere and pure water can be reduced during water washing operation. Thus, impurities in the atmosphere can be prevented from penetrating into the pure water. Since the surface area further increases as the wafer diameter is increased to meet an anticipated demand, the effectiveness of the wafer top that is attached to the outer tube nozzle is augmented. If $N_2$ is discharged through the outer tube nozzle during the drying process, the atmosphere cannot penetrate through the gap between the semiconductor wafer and the wafer top, so that an $N_2$ atmosphere can be formed over the wafer surface. Thus, production of watermarks that is attributable to the presence of oxygen in the atmosphere can be restrained.

In the case where the semiconductor wafer is rotated by means of the rotating chuck as the fluid mixture is discharged through the coaxial multi-nozzle, it is preferable that the respective discharge centers of the outer and inner tube nozzles are on the center of rotation of the semiconductor wafer, so that the chemical fluids can be spread more uniformly over the semiconductor wafer. The optimum value of the distance between the wafer top and the semiconductor wafer changes depending on the delivery of the chemical fluids or pure water and the delivery of $N_2$. By freely adjusting this distance so that the gap between the semiconductor wafer and the wafer top is filled up with a liquid during a chemical fluid treatment or water washing operation, in particular, therefore, production of mists or volatilization of the fluids can be restrained most effectively. During the water washing operation, moreover, the pure water is never touched by the atmosphere, so that impurities in the atmosphere can be fully prevented from penetrating into the pure water.

A second embodiment of the present invention will now be described with reference to FIG. 3.

Figure 3:
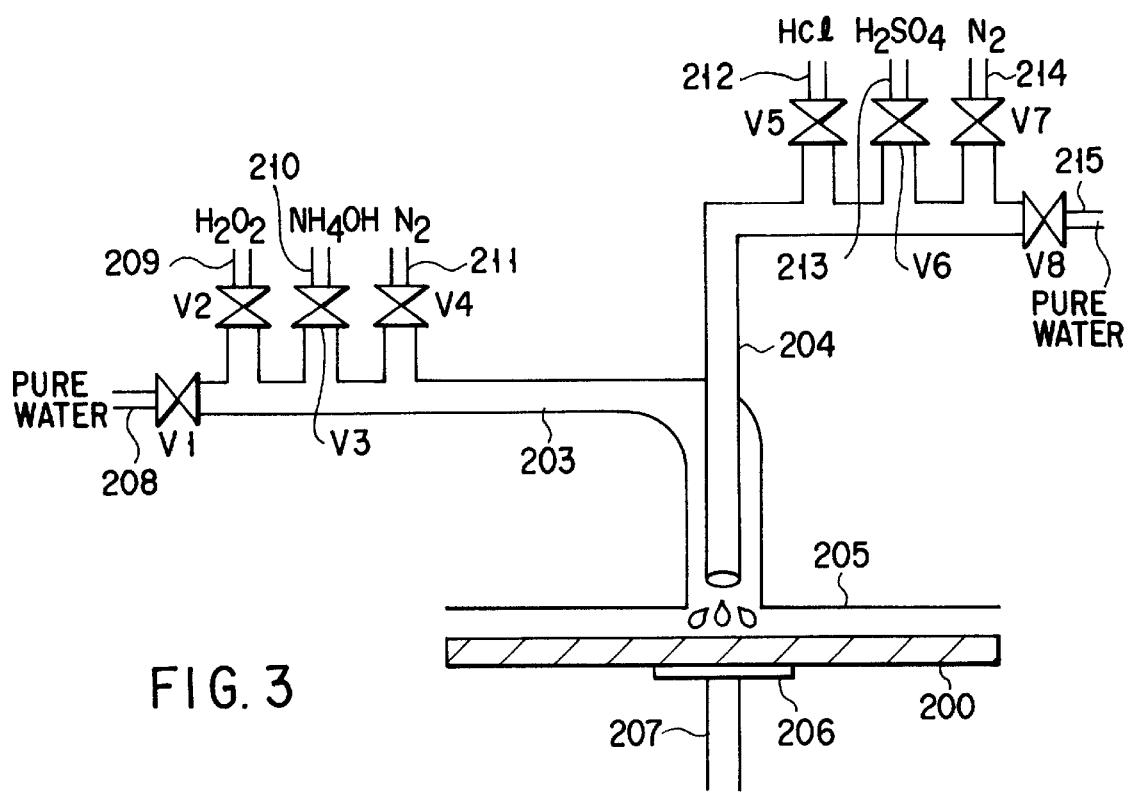
FIG. 3 is a sectional view of a substrate treating apparatus according to a second embodiment of the present invention.

FIG. 3 is a sectional view of a substrate treating apparatus. In connection with this embodiment, there will be described an apparatus for actually supplying the chemical fluids and nitrogen gas to the multi-nozzle. The treating apparatus, which may be located in an adjustable-atmosphere chamber, can carry out treating operation in an open-to-atmosphere system. In this embodiment, the treating apparatus is located in an open-to-atmosphere system.

The treating apparatus shown in FIG. 3 is provided with a stage 206 that supports a semiconductor wafer 200 as a substrate to be treated. The stage 206 is fitted with a rotating chuck 207, and the stage 206 can be rotated with the semiconductor wafer 200 thereon by a motor, not shown. Further, the treating apparatus is provided with a elevator mechanism, not shown, for vertically moving the stage 206 and the rotating chuck 207, whereby a space between the semiconductor wafer and a wafer top can be adjusted as required. The semiconductor wafer 200 is supported on the stage 206 so as to face a multi-nozzle. The multi-nozzle is composed of an outer tube nozzle 203, which is connected to a supply pipe, and an inner tube nozzle 204 coaxially located in the outer tube nozzle 203. A wafer top 205 is mounted on the distal end portion of the outer tube nozzle 203 that faces the semiconductor wafer 200. It extends parallel to the semiconductor wafer 200. Since the wafer top 205 is attached on the distal end portion of the outer tube nozzle 203, then there is no space formed therebetween. In this embodiment described above, it is preferable that the wafer top attached to the outer tube nozzle has an area equal to or greater than the wafer area, as shown in FIG. 2A, since the treating apparatus is located in an open-to-atmosphere.

Chemical fluids, pure water, inert gas, etc. are supplied through the outer and inner tube nozzles 203 and 204, and discharged from the outer and inner tube nozzles 203 and 204 onto the surface of the semiconductor wafer 200 to clean the wafer surface. When the chemical fluids are simultaneously discharged from the outer and inner tube nozzles 203 and 204, they are mixed in the vicinity of the discharge ports of the nozzles 203 and 204, that is, near the semiconductor wafer 200, and then the resulting fluid mixture is supplied onto the surface of the semiconductor wafer 200 to clean the wafer surface. The outer tube nozzle 203 is connected with branch pipes 208 to 211 through valves V1 to V4, respectively, while the inner tube nozzle 204 is connected with branch pipes 212 to 215 through valves V5 to V8, respectively. The branch pipes 208 and 215 are supplied with pure water, and the branch pipes 211 and 214 with $N_2$ gas. The branch pipes 209 and 210 are supplied with $H_2O_2$ and $NH_4OH$, respectively. Further, the branch pipes 212 and 213 are supplied with HCl and $H_2SO_4$, respectively.

After the semiconductor wafer 200 is mounted on the stage 206, the rotating chuck 207 is rotated by the motor to turn the semiconductor wafer 200. As the semiconductor wafer 200 is rotated, the fluid mixture is discharged fro the multi-nozzle onto the semiconductor wafer. It is preferable that the respective discharge centers of the outer and inner tube nozzles 203 and 204 are on the center of the semiconductor wafer 200. In such a case, chemical fluids that are discharged through the nozzles 203 and 204 spread uniformly over the semiconductor wafer 200. Thus, the mixture of the chemical fluids is not subject to unevenness.

The valves that are connected to the outer and inner tube nozzles 203 and 204 are suitably opened or closed to select the chemical fluids to be mixed. For example, a mixture of HCl and $H_2O_2$, a mixture of $H_2O_2$ and $H_2SO_4$, etc. are prepared. The valves are opened or closed to adjust the mixture ratios of the chemical fluids contained in the fluid mixture. For example, $H_2O_2$ and $H_2SO_4$ are mixed in the ratio of 1:6 to 1:10 to form an etching agent with which a photoresist is removed by etching. Further, $H_2O_2$ with a concentration of about 30% and $H_2SO_4$ with a concentration of 96 to 98% are mixed in the ratio of 1:1 to form an etching agent with which a metal film of Al, Cu, Ti, or TiN is patterned.

Since the rotating chuck 207 can be moved up and down by an elevator mechanism, though not shown, the distance between the wafer top 205 and the semiconductor wafer 200 can be adjusted freely. This distance can be adjusted while the chemical fluids or pure water is being discharged so that a space between the semiconductor wafer 200 and the wafer top 205 is filled up with the chemical fluid mixture or pure water to prevent the atmosphere from penetrating through the gap between the semiconductor wafer and the wafer top.

The chemical fluids supplied to the branch pipes are not limited to the materials shown in FIG. 3. For example, ozone ($O_3$) water, alkaline ionic water, and acidic ionic water may be supplied in place of $H_2O_2$, $NH_4OH$, and HCl to the branch pipes 209, 210 and 212, respectively. Alkaline and acidic waters, which are formed by means of an ionic water forming apparatus, are utilized in various fields, including manufacture of semiconductor devices, liquid crystals, etc., in particular. Pure water is a high-purity water with a resistivity of about 5 to 18 MΩ cm, which is substantially cleared of impurities, such as ions, microorganisms, organic matter, etc. Pure water is also a purer water with very high purity obtained by efficiently removing suspended matter, dissolved matter from water by means of an ultrapure water maker. Electrolysis of these waters (referred to collectively as pure water) produces ionic waters, such as highly oxidative anodic water, highly reductive cathodic water, etc.

According to this embodiment, as described above, pure water or different chemical fluids are simultaneously discharged from the multi-nozzle, and the fluids are mixed immediately before the discharge in the vicinity of the semiconductor wafer. Unlike the prior art case where a fluid mixture is prepared in advance, therefore, there is no possibility of the chemical fluids, such as hydrogen peroxide, decomposing and changing their compositions. In contrast with the prior art case where a plurality of nozzles are arranged directly in front of a semiconductor wafer so that there are different discharge positions, the chemical fluids that are discharged individually from the outer and inner tube nozzles spread uniformly over the semiconductor wafer, so that the mixture of the fluids is less liable to unevenness. Since the wafer top is mounted on the distal end portion of the discharge port side of the outer tube nozzle and thus no open-air-space exist therebetween, the chemical fluids over the wafer surface can be restrained from producing mists or volatilizing, and the area of contact between the atmosphere and pure water can be reduced during water washing operation. Thus, impurities in the atmosphere can be prevented from penetrating into the pure water. Since the surface area further increases as the wafer diameter is increased, the effectiveness of the wafer top that is attached to the outer tube nozzle is augmented.

A third embodiment of the present invention will now be described with reference to FIG. 4.

Figure 4:
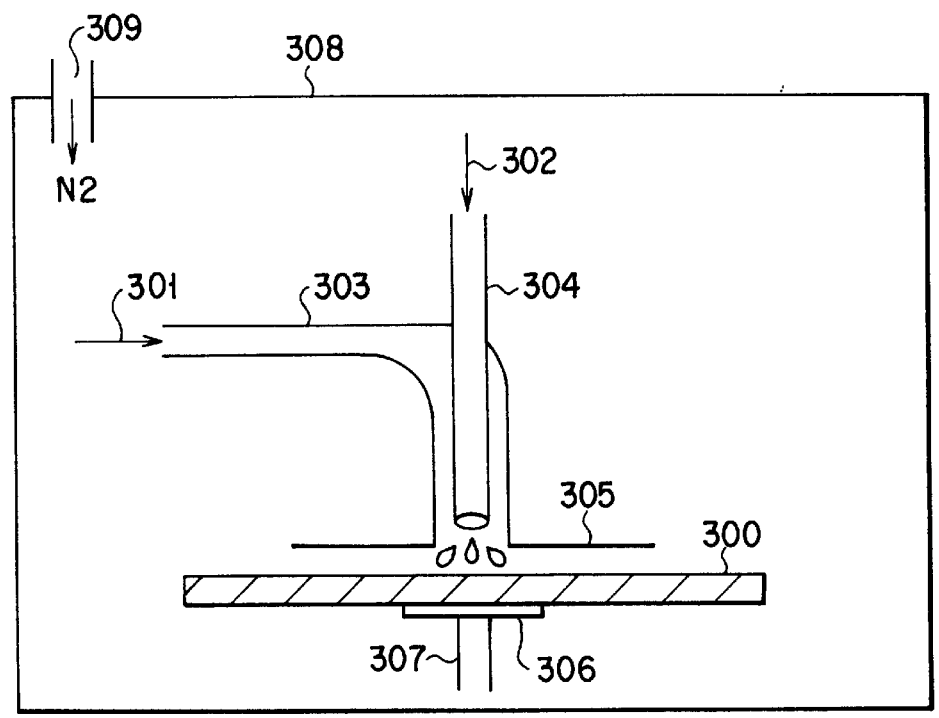
FIG. 4 is a sectional view of a substrate treating apparatus according to a third embodiment of the present invention.
Figure 5:
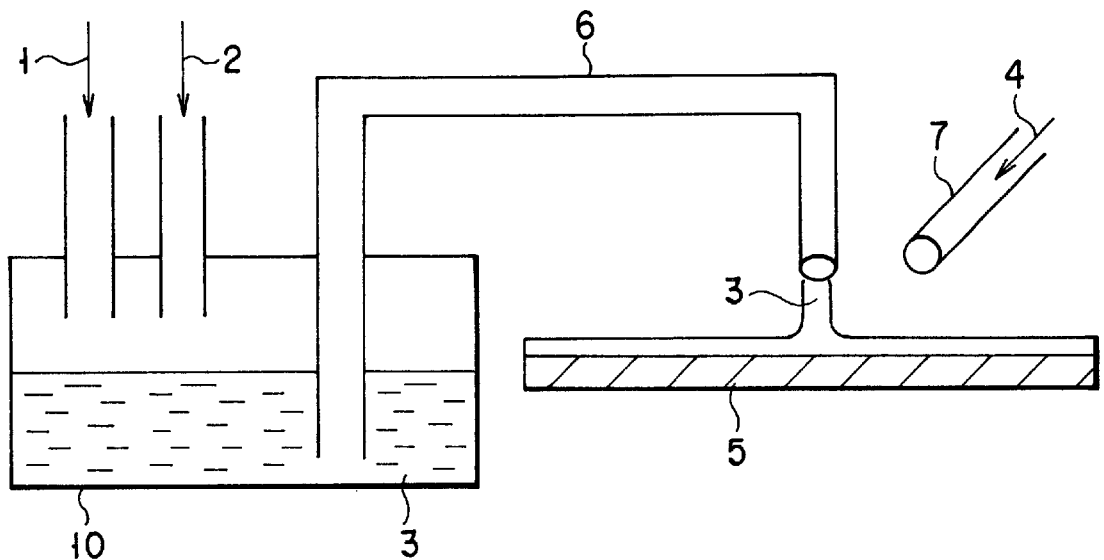
FIG. 5 is a sectional view of a conventional substrate treating apparatus.
Figure 6:
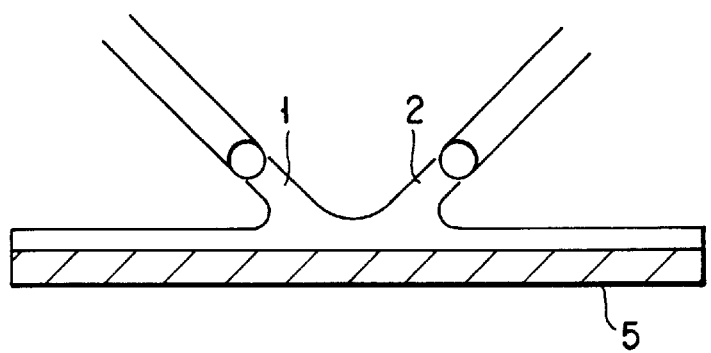
FIG. 6 is a sectional view of another conventional substrate treating apparatus.

FIG. 4 is a sectional view of a substrate treating apparatus. In this embodiment, the treating apparatus is located in a treatment chamber. It is provided with a stage 306 that supports a semiconductor wafer 300 as a substrate to be treated. The stage 306 is fitted with a rotating chuck 307, and the stage 306 can be rotated with the semiconductor wafer 300 thereon by a motor, not shown. The semiconductor wafer 300 is supported on the stage 306 so as to face the multi-nozzle. The multi-nozzle is composed of an outer tube nozzle 303, which is connected to a supply pipe, and an inner tube nozzle 304 coaxially located in the outer tube nozzle 303.

A wafer top 305 is mounted on the distal end portion of the outer tube nozzle 303 that faces the semiconductor wafer 300. It extends parallel to the semiconductor wafer 300. Since the wafer top 305 is attached to the distal end potion of the outer tube nozzle 303, then there is no space formed therebetween. Chemical fluids, pure water, inert ($N_2$) gas, etc. are discharged from the surface of the semiconductor wafer 200 to clean the wafer surface. When the chemical fluids are simultaneously discharged from the outer and inner tube nozzles 303 and 304, they are mixed in the vicinity of the discharge ports of the nozzles 303 and 304, that is, near the semiconductor wafer 300, and then the resulting fluid mixture is supplied onto the surface of the semiconductor wafer 300 to clean the wafer surface.

After the semiconductor wafer 300 is mounted on the stage 306, the rotating chuck 307 is rotated by the motor, not shown, to turn the semiconductor wafer 300. As the semiconductor wafer 300 is rotated, the fluid mixture is discharged from the multi-nozzle onto the semiconductor wafer 300. It is preferable that the respective discharge centers of the outer and inner tube nozzles 303 and 304 are on the center of the semiconductor wafer 300. In such a case, chemical fluids 301 and 302 that are discharged through the nozzles 303 and 304 spread uniformly over the semiconductor wafer 300. Thus, the mixture of the chemical fluids 301 and 302 is not subject to unevenness.

Since the rotating chuck 307 can be moved up and down by an elevator mechanism, not shown, the distance between the wafer top 305 and the semiconductor wafer 300 can be adjusted freely. The distance can therefore be adjusted so that a space between the semiconductor wafer 300 and the wafer top 305 is filled up with pure water or the chemical fluid mixture when pure water or the chemical fluids is discharged.

The treating apparatus is operated in a treatment chamber 308, not in an open-to-atmosphere system. A nozzle 309 is attached to the treatment chamber 308 so that $N_2$ gas can be fed into the treatment chamber 308 through the nozzle 309 during treating operation. The diameter of the wafer top 305 is smaller than that of the semiconductor wafer 300 (like the wafer top shown in FIG. 2B), so that the semiconductor wafer 300 projects from the wafer top 305.

According to this embodiment, as described above, pure water or different chemical fluids are simultaneously discharged from the multi-nozzle, and the fluids are mixed immediately before the discharge in the vicinity of the semiconductor wafer. Unlike the prior art case where a fluid mixture is prepared in advance, therefore, there is no possibility of the chemical fluids, such as hydrogen peroxide, decomposing and changing their compositions. In contrast with the prior art case where a plurality of nozzles are arranged directly in front of a semiconductor wafer so that there are different discharge positions, the chemical fluids that are discharged individually from the outer and inner tube nozzles spread uniformly over the semiconductor wafer, so that the mixture of the fluids is less liable to unevenness. Since the wafer top is mounted on the distal end portion of the discharge port side of the outer tube nozzle, the chemical fluids over the wafer surface can be restrained from producing mists or volatilizing. According to this embodiment, moreover, the treating apparatus is located in a nitrogen atmosphere, so that impurities in the atmosphere do not penetrate into pure water. Thus, the influence of the atmosphere need not be taken into consideration, so that the wafer top can be reduced in size, and one treating apparatus can handle semiconductor wafers of different sizes. Since the surface area further increases as the diameter of modern semiconductor wafers is increased, the effectiveness of the wafer top that is attached to the outer tube nozzle is augmented.

According to the present invention, pure water or different chemical fluids are simultaneously discharged, and fluids can be mixed near the to-be-treated substrate. Therefore, the chemical fluids cannot decompose and change their compositions. Since the chemical fluids that are discharged individually from the outer and inner tube nozzles spread uniformly over the substrate, the mixture of the fluids is not subject to unevenness. Moreover, since the outer tube nozzle has the top structure and thus there is provided no open-air-space therebetween, the chemical fluids over the wafer surface can be restrained from producing mists or volatilizing. During water washing operation, the area of contact between the atmosphere and pure water can be reduced, so that impurities in the atmosphere can be prevented from penetrating into the pure water.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of cleaning a substrate comprising:
   setting a substrate to-be-treated substantially in parallel to ends of multi-nozzles including an inner tube nozzle and an outer tube nozzle to oppose each other;

cleaning the substrate by discharging, to the substrate, a chemical fluid, a combination of a chemical fluid and a gas, pure water, or a combination of pure water and a gas through the outer tube nozzle and simultaneously discharging a chemical fluid, a combination of a chemical fluid and a gas, pure water, or a combination of pure water and a gas through the inner tube nozzle; and washing the substrate by discharging pure water to the substrate through at least one of the inner tube nozzle and the outer tube nozzle.

2. A method of cleaning a substrate according to claim 1, further comprising drying the substrate washed by pure water.

3. A method of cleaning a substrate according to claim 2, wherein a gas is discharged through at least one of the inner tube nozzle and the outer tube nozzle during the drying of the substrate to prevent atmosphere air from being introduced into a gap between the substrate and the inner and outer nozzles.

4. A method of cleaning a substrate according to claim 3, wherein the gas discharged during the drying of the substrate is nitrogen.

5. A method of cleaning a substrate according to claim 1, wherein a substrate treating apparatus including the inner and outer tube nozzles is set in a treatment chamber containing a nitrogen atmosphere.

6. A method of cleaning a substrate according to claim 1, wherein the end of the outer tube nozzle has a wafer top facing the substrate.

* * * * *